United States Patent
Venugopal et al.

(10) Patent No.: US 11,159,176 B1
(45) Date of Patent: Oct. 26, 2021

(54) DATA-ASSISTED LDPC DECODING

(71) Applicant: Western Digital Technologies, Inc., San Jose, CA (US)

(72) Inventors: Abhinandan Venugopal, Bangalore (IN); Amit Sharma, Bangalore (IN); Vinayak Bhat, Bangalore (IN); Eran Sharon, Rishon Lezion (IL); Ran Zamir, Ramat Gan (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/913,044

(22) Filed: Jun. 26, 2020

(51) Int. Cl.
*H03M 13/11* (2006.01)
*H03M 13/39* (2006.01)
*H03M 13/45* (2006.01)
*H03M 13/29* (2006.01)

(52) U.S. Cl.
CPC .... *H03M 13/1111* (2013.01); *H03M 13/1177* (2013.01); *H03M 13/2948* (2013.01); *H03M 13/3927* (2013.01); *H03M 13/3961* (2013.01); *H03M 13/458* (2013.01)

(58) Field of Classification Search
CPC .................................................. H03M 13/1111
See application file for complete search history.

(56) References Cited

U.S. PATENT DOCUMENTS

| | | | |
|---|---|---|---|
| 9,450,610 B1* | 9/2016 | Micheloni | G06F 11/1012 |
| 10,944,424 B1* | 3/2021 | Wang | G06F 11/1068 |
| 2013/0163330 A1* | 6/2013 | Sharon | G06F 11/1072 |
| | | | 365/185.09 |
| 2017/0148510 A1* | 5/2017 | Bazarsky | G11C 16/26 |
| 2018/0076832 A1* | 3/2018 | Haga | G11C 16/349 |
| 2018/0225041 A1* | 8/2018 | Chen | H03M 13/6502 |
| 2018/0225042 A1* | 8/2018 | Chen | G06F 3/0619 |
| 2018/0262215 A1* | 9/2018 | Sharon | G06F 11/1012 |
| 2018/0293009 A1 | 10/2018 | Sharon et al. | |
| 2020/0212939 A1* | 7/2020 | Sridhara | H03M 13/6577 |

* cited by examiner

*Primary Examiner* — Joseph D Torres
(74) *Attorney, Agent, or Firm* — Dickinson Wright PLLC; Steven Hurles (57) ABSTRACT

A decoding system and method of a non-volatile memory are provided in which information regarding a characteristic of a non-volatile memory is used to determine an initial log-likelihood-ratio (LLR) table from among a number of LLR tables. The decoding is then performed using the determined initial LLR table.

9 Claims, 8 Drawing Sheets

DATA-ASSISTED LDPC DECODING

BACKGROUND

1. Field

Apparatuses and methods consistent with example embodiments relate to systems and methods for data-assisted low density parity check (LDPC) decoding, and more particularly to LDPC decoding in which metadata indicating a state of at least a portion of the memory is utilized in selection and/or modification of log-likelihood ratios (LLRs).

2. Description of the Related Art

During a preliminary stage of a low density parity check (LDPC) decoding operation, bits are read from memory, e.g. a NAND memory die, and are translated into probabilities for each bit. These probabilities are represented as log-likelihood ratios (LLRs), where an LLR for any given bit b may be represented by:

$$LLR_b(v) = \log \frac{Pr(b=0|V)}{Pr(b=1|V)},$$

where V is data from the memory die. The sign of the LLR represents whether the bit is estimated as a 1 or a 0, and the magnitude of the LLR represents the reliability of the bit.

The error correction code (ECC) decoder translates the bits into LLRs using predefined tables that are part of a static configuration. These values stored in the tables are calculated offline using assumptions about the memory error model—for example, a Gaussian distribution.

In practice, however, the actual memory error distribution of a memory array can be very different from the assumed model. In such a case, the actual probabilities may be very different form the ones used to calculate the LLRs, and this mismatch degrades the decoder performance and correction capability.

Figure 1:
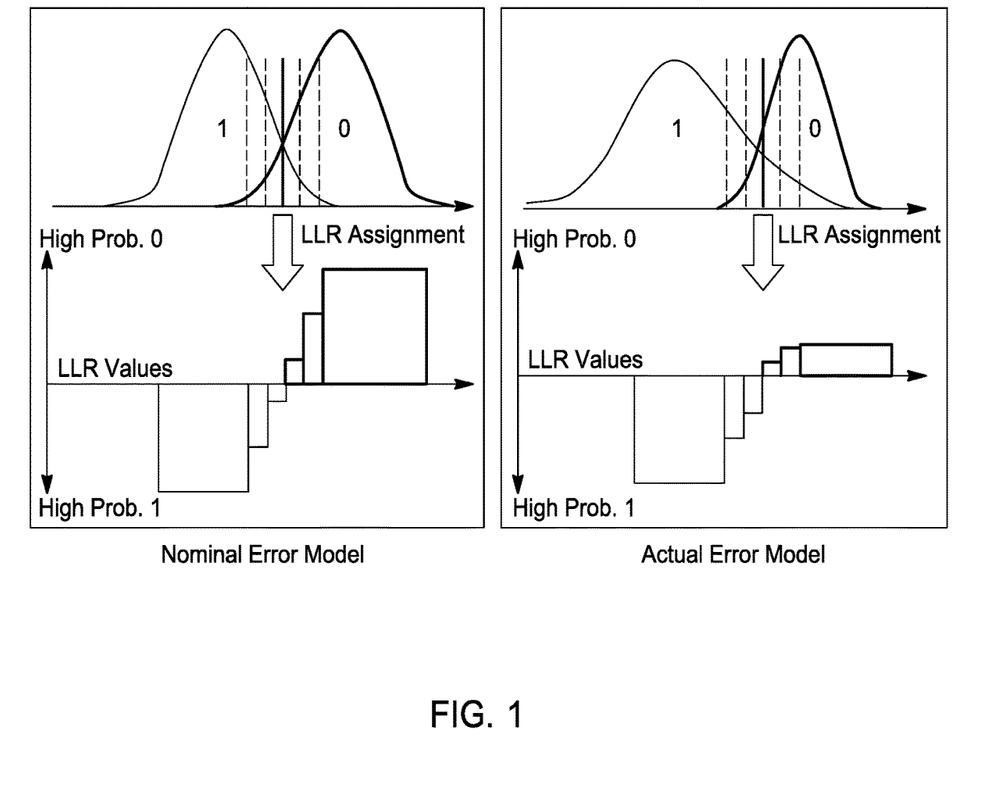
FIG. 1 is an example of memory error model mismatch and optimal LLR assignments.

FIG. 1 illustrates an example of memory error model mismatch and optimal LLR assignments. As shown, the actual error model is different from the nominal/assumed error model. In the example, the offline LLRs are configured based on a Gaussian model State-Transition-Matrix (STM). However, the actual STM may be very different from the Gaussian case leading to sub-optimal LLRs and degraded decoding capabilities.

The characteristics of memory failures vary based on any of a number of system parameters including, but not limited to, program and read temperatures and program-erase cycles. Furthermore, certain word lines (WLs), referred to as outliers, behave differently from standard block characteristics.

Figure 2:
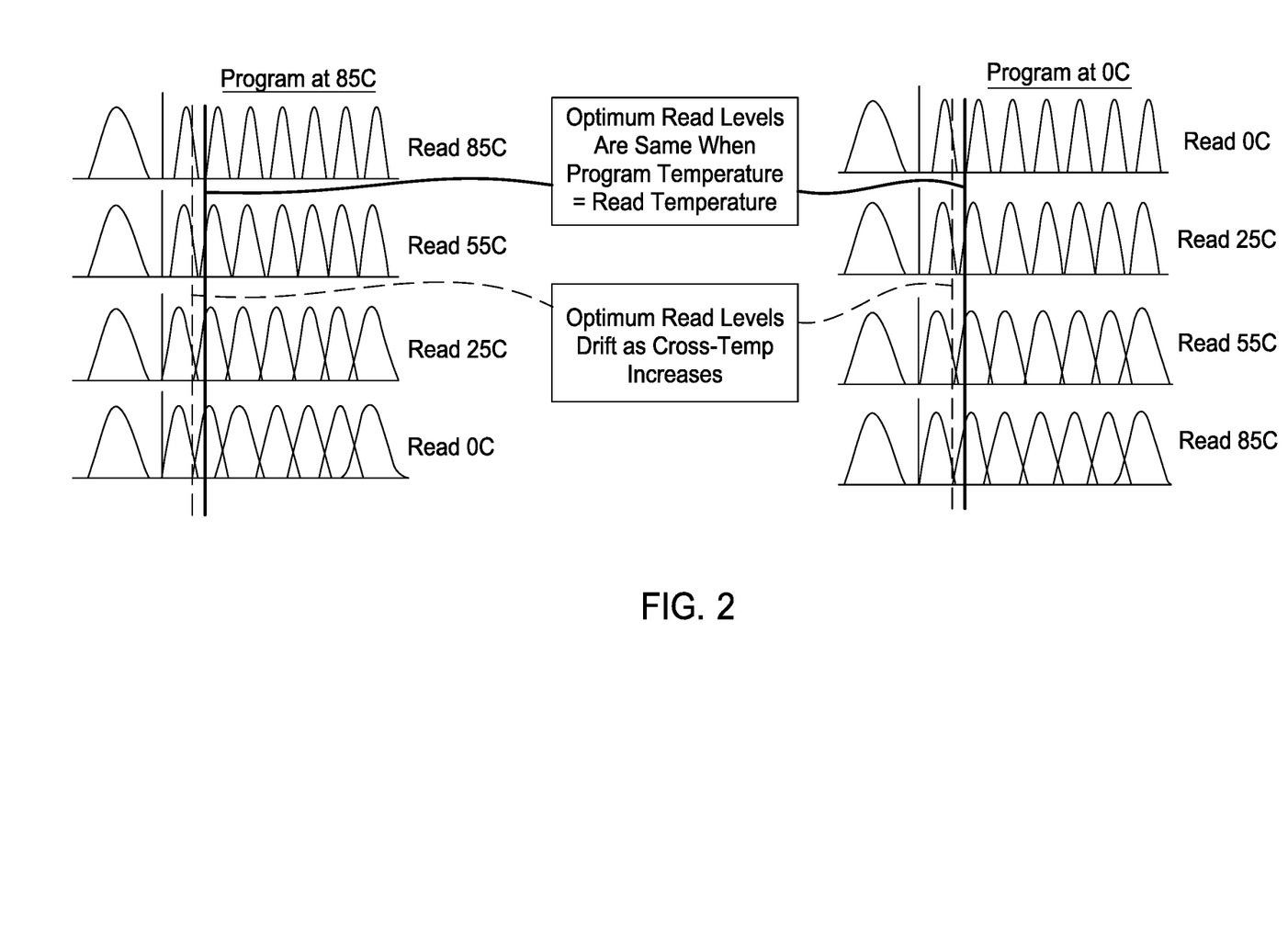
FIG. 2 illustrates overlapping and drifted threshold voltages ($V_t$) due to "cross-temperature" differences between a temperature at which a memory block is programmed and a temperature at which the memory block is read.

FIG. 2 illustrates the overlapping and drifted threshold voltage ($V_t$) due to "cross-temperature" differences between a temperature at which a block is programmed and a temperature at which the same block is read. As shown, optimum read levels are the same when the program temperature is the same as the read temperature. However, as the difference between the program temperature and the read temperature increases, the optimum read levels drift, and the Gaussian curve expands, so that there is higher overlapping threshold voltage.

In addition to read and program temperatures, overcycling is another characteristic that effects the actual STM. A characteristic of NAND is that data is guaranteed for a certain number of program-erase cycles (PEC). At the beginning of life (BOL), the overlap of $V_t$ distributions are at a low bit count level—for example about a 30 bit count level for a Triple Level Cell (TLC) block. However, for an over-cycled end of life (EOL) block, the $V_t$ overlaps are at a high bit count level, for example about a 100 bit count level for a TLC block. Analogous issues are found in Single Level Cell (SLC) blocks. It is understood that due to over cycling effects, blocks become less accurate in reading over time.

Certain WLs in a block may also show deviation from block characteristics. Such WLs are commonly edge WLs, located at the beginning and end of the WLs in a block. Certain outlier WLs also show sensitivities or specific disturbs, such as temperature, or program disturbs, resulting in a higher Er tail bit.

SUMMARY

Example embodiments may address at least the above problems and/or disadvantages and other disadvantages not described above. Also, example embodiments are not required to overcome the disadvantages described above, and may not overcome any of the problems described above.

According to an aspect of an example embodiment, a decoding method is provided. The decoding method comprises: reading a codeword from a non-volatile memory; receiving metadata comprising information of at least one characteristic of a plurality of characteristics of the non-volatile memory; determining an initial log-likelihood-ratio (LLR) table from among the plurality of LLR tables based on the metadata; decoding the codeword using the determined initial LLR table.

The at least one characteristic of the non-volatile memory may be at least one of a current read voltage level, a cross-temperature difference, a program-erase cycle status, and a location of the codeword in the non-volatile memory.

Prior to the reading the codeword, the method may include creating the plurality of LLR tables, wherein each of the plurality of LLR tables corresponds to at least one of the plurality of characteristics of the non-volatile memory.

The creating the plurality of LLR tables may include creating an a-priori state-transition-matrix (STM) for each of the plurality of characteristics of the non-volatile memory.

The determining the initial LLR table may include: performing a drifted reliability matrix calculation by deriving a characteristic weightage for the at least one characteristic of the non-volatile memory based on the metadata and the a-priori STM for the at least one characteristic.

The determining the initial LLR table may include matching the metadata with one of the plurality of LLR tables most closely corresponding to the at least one characteristic.

The decoding may include low density parity check decoding.

The decoding may include performing multiple decoding iterations using the initial LLR table.

The decoding may include performing at least one decoding iteration using the initial LLR table, and updating the initial LLR table to create an updated LLR table and performing at least one decoding iteration using the updated LLR table.

According to an aspect of another example embodiment, a non-volatile memory system is provided, including: a non-volatile memory; and a controller circuit. The non-volatile memory is configured to transmit, to the controller circuit, a codeword; and the controller circuit comprises a decoder configured to: receive metadata comprising information of at least one characteristic of a plurality of characteristics of the non-volatile memory; determine an initial log-likelihood-ratio (LLR) table from among the plurality of LLR tables based on the metadata; decode the codeword using the determined initial LLR table.

According to an aspect of another example embodiment a non-volatile computer-readable medium is provided, having recorded thereon a program which, when executed by a processor, causes the processor to execute a method comprising: reading a codeword from a non-volatile memory; receiving metadata comprising information of at least one characteristic of a plurality of characteristics of the non-volatile memory; determining an initial log-likelihood-ratio (LLR) table from among the plurality of LLR tables based on the metadata; and decoding the codeword using the determined initial LLR table.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Figures 3A, 3B:
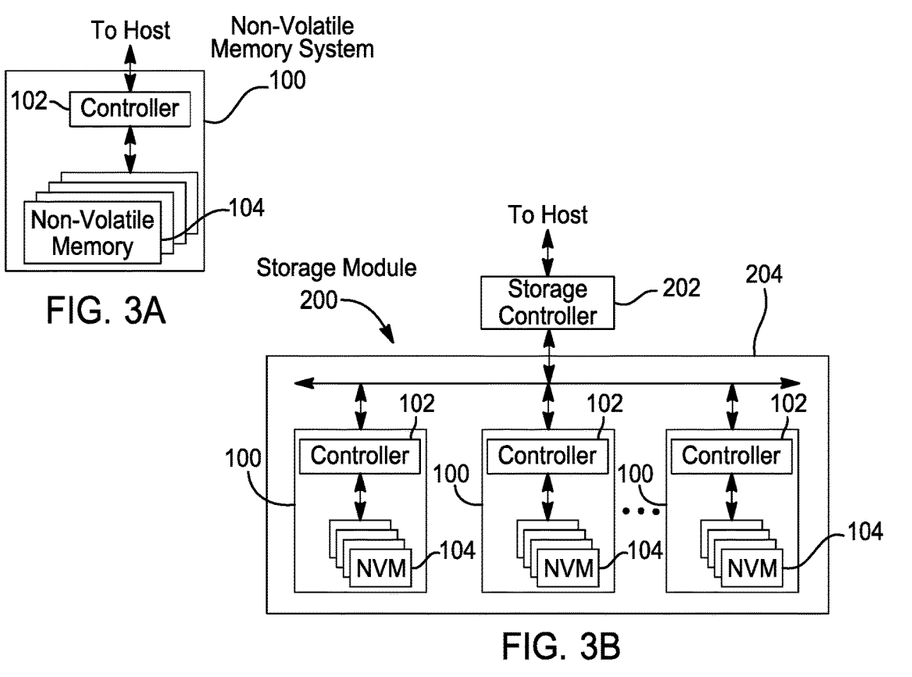
FIG. 3A is a block diagram illustrating a non-volatile memory system 100 according to an example embodiment.
FIG. 3B illustrates a storage module that includes a plurality of non-volatile memory systems, according to an example embodiment.

FIG. 3A is a block diagram illustrating a non-volatile memory system 100. The non memory system 100 may include a controller 102 and memory that may be made up of one or more non-volatile memory dies 104. As used herein, the term die refers to a set of non-volatile memory cells that are formed on a single semiconductor substrate, and associated circuitry for managing physical operation of those memory cells. The controller 102 may interface with a host system and transmit command sequences for read, program, and erase operations to the memory die(s) 104.

The controller 102 (which may alternately be referred to as a flash memory controller) can take the form of processing circuitry, a microprocessor or processor, and a memory (i.e. a computer-readable medium) that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown or described herein as being internal to the controller can also be implemented as external to the controller, and other components can be used. Additionally, the phrase "operatively in communication with" may mean directly in communication with or indirectly (wired or wireless) in communication with via one or more components, which may or may not be shown or described herein.

The controller 102 may be configured to manage data stored in the memory 104 and communicate with a host, such as a computer or electronic device. The controller 102 may provide any one or more of various functionalities in addition to those specifically described herein. For example, the controller 102 can format the memory 104 to ensure that the memory 104 is operating properly, can map out bad memory cells, and can allocate spare cells to be substituted for future failed cells. In one or more example embodiments, some part of the spare cells can be used to hold firmware to operate the controller 102 and implement other features. In operation, when a host wants to read data from or write data to the memory 104, the host will communicate with the controller 102. If the host provides a logical address to which data is to be read/written, the controller 102 can convert the logical address received from the host to a physical address in the memory 104. Alternately, the host may provide the physical address. The controller 102 can also perform any of various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface. In one example embodiment, the memory system 100 may be a card based system, such as a secure digital (SD) or a micro secure digital (micro-SD) card. Alternately, the system 100 may be part of an embedded memory system.

The non-volatile memory system 100 may include a single channel between the controller 102 and the non-volatile memory die(s) 104, or may include multiple (e.g., 2, 4, 8 or more) channels between the controller 102 and the NAND memory die(s) 104. The number of channels may depend on any of various factors, such as the capabilities of the controller 102, the number of memory dies 104, and/or layout or organization of the memory elements in the memory die(s) 104, as non-limiting examples. In any of the embodiments described herein, more than a single channel may exist between the controller and the memory die(s)s 104, even if a single channel is shown in the drawings.

FIG. 3B illustrates a storage module 200 that includes a plurality of non-volatile memory systems 100. As such, the storage module 200 may include a storage controller 202 that interfaces with a host and with a storage system 204, which includes the plurality of non-volatile memory systems 100. The interface between the storage controller 202 and non-volatile memory systems 100 may be, but is not limited to, a bus interface, such as a serial advanced technology attachment (SATA), a peripheral component interface express (PCIe) interface, an embedded MultiMediaCard (eMMC) interface, an SD interface, or a Universal Serial Bus (USB) interface, or the like, as would be understood by one of skill in the art. The storage system 200 may be a solid state drive (SSD), such as found in portable computing devices, such as laptop computers and tablet computers, and mobile phones.

Figure 3C:
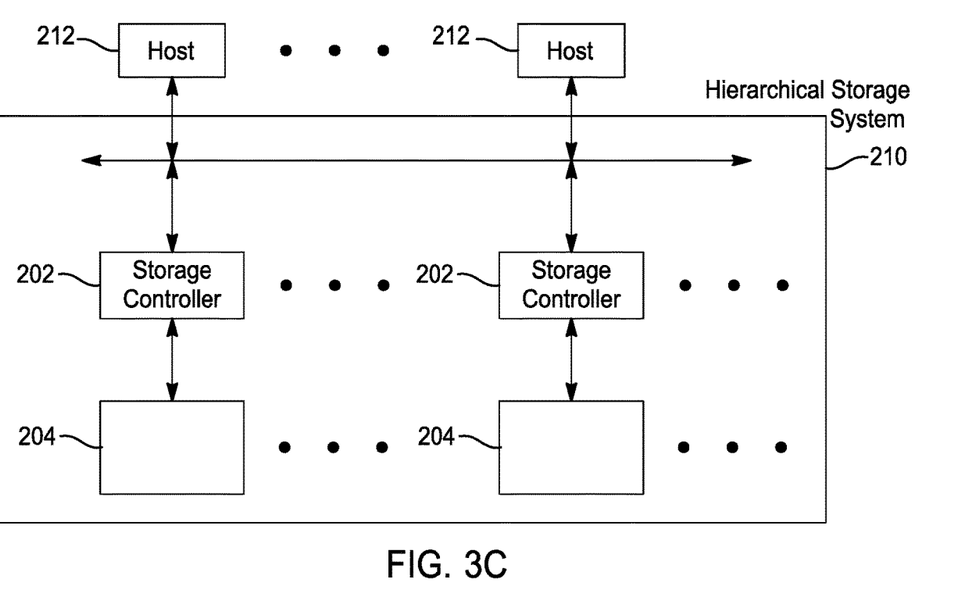
FIG. 3C is a block diagram illustrating a hierarchical storage system.

FIG. 3C is a block diagram illustrating a hierarchical storage system 210. The hierarchical storage system 210 may include a plurality of storage controllers 202, each of which controls a respective storage system 204. Host systems 212 may access memories within the hierarchical storage system 210 via a bus interface. Example bus interfaces may include, but are not limited to, a non-volatile memory express (NVMe), a fiber channel over Ethernet (FCoE) interface, an SD interface, a USB interface, an SATA interface, a PCIe interface, or an eMMC interface as examples. The storage system 210 illustrated in FIG. 3C may be a rack-mountable mass storage system that is accessible by multiple host computers, such as would be found in a data center or other location where mass storage is needed.

Figure 4A:
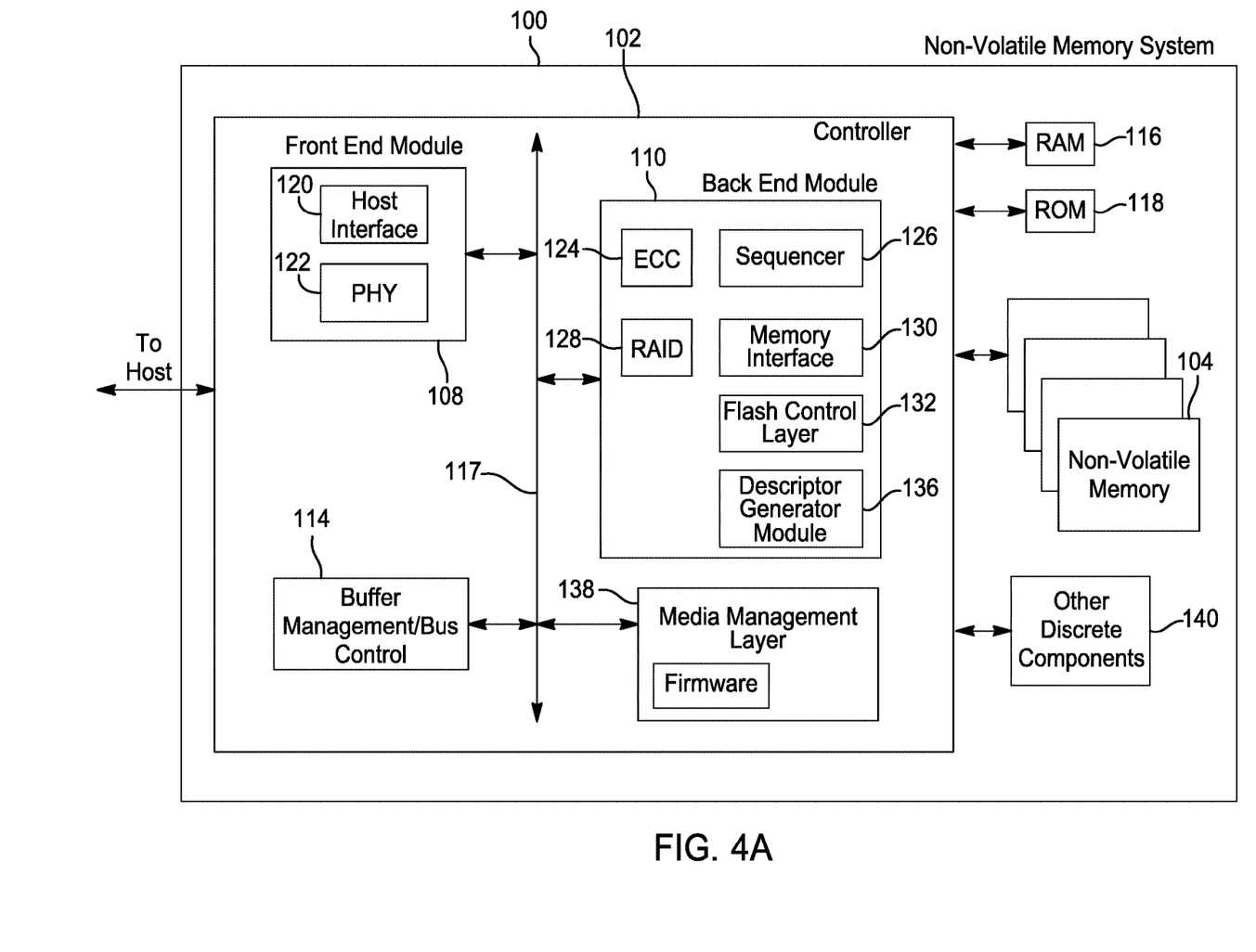
FIG. 4A is a block diagram illustrating example components of a controller, according to an example embodiment.

FIG. 4A is a block diagram illustrating example components of the controller 102 in more detail. The controller 102 may include a front end module 108 that interfaces with a host, a back end module 110 that interfaces with the non-volatile memory die(s) 104, and various other modules that perform various functions of the non-volatile memory system 100.

As used herein, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or software, or combination thereof. In addition or alternately, each module may include memory hardware that comprises instructions executable by a processor or processor circuitry to implement one or more of the features of the module. When a module includes a portion of the memory that comprises instructions executable with the processor, the module may or may not include the processor. In some examples, a module may just be the portion of the memory that comprises instructions executable with the processor to implement the features of the corresponding module without the module including any other hardware. Because each module includes at least some hardware even when the included hardware also comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 4A as located separately from the controller 102, one or both of the RAM 116 and the ROM 118 may be located within the controller 102. Alternately portions of RAM 116 and ROM 118 may be located both within the controller 102 and outside the controller 102. Further, in some example implementations, the controller 102, the RANI 116, and the ROM 118 may be located on separate semiconductor dies.

The front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, Serial Advanced Technology Attachment (SATA), SATA Express, SAS, Fibre Channel, USB, peripheral component interconnect express (PCIe), and non-volatile memory express (NVMe). The host interface 120 may typically facilitate transfer of data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a Redundant Array of Independent Drives (RAID) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. The memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 4A may include a media management layer 138, which may perform certain storage management functions, such as address management and wear leveling of memory cells of the non-volatile memory die 104. The non-volatile memory system 100 may also include other discrete components 140, such as external electrical interfaces, external RAM, resistors, capacitors, or other components that may interface with controller 102. In one or more example embodiments, one or more of the RAID module 128, the media management layer 138, and the buffer management/bus controller 114 are optional components that may be omitted from the controller 102.

The non-volatile memory system 100 may also include one or more temperature sensors 157. For example, a temperature sensor 157 may be configured to measure a temperature and to provide an indication of the measured temperature to the controller 102, such as a read temperature or a write temperature. The temperature sensor(s) 157 may be responsive to one or more commands, such as a command to measure temperature. One or more temperature sensor(s) may be provided within each of the non-volatile memory dies 104, and/or one or more temperature sensors 157 may be external thereto, as shown in FIG. 4B.

Figure 4B:
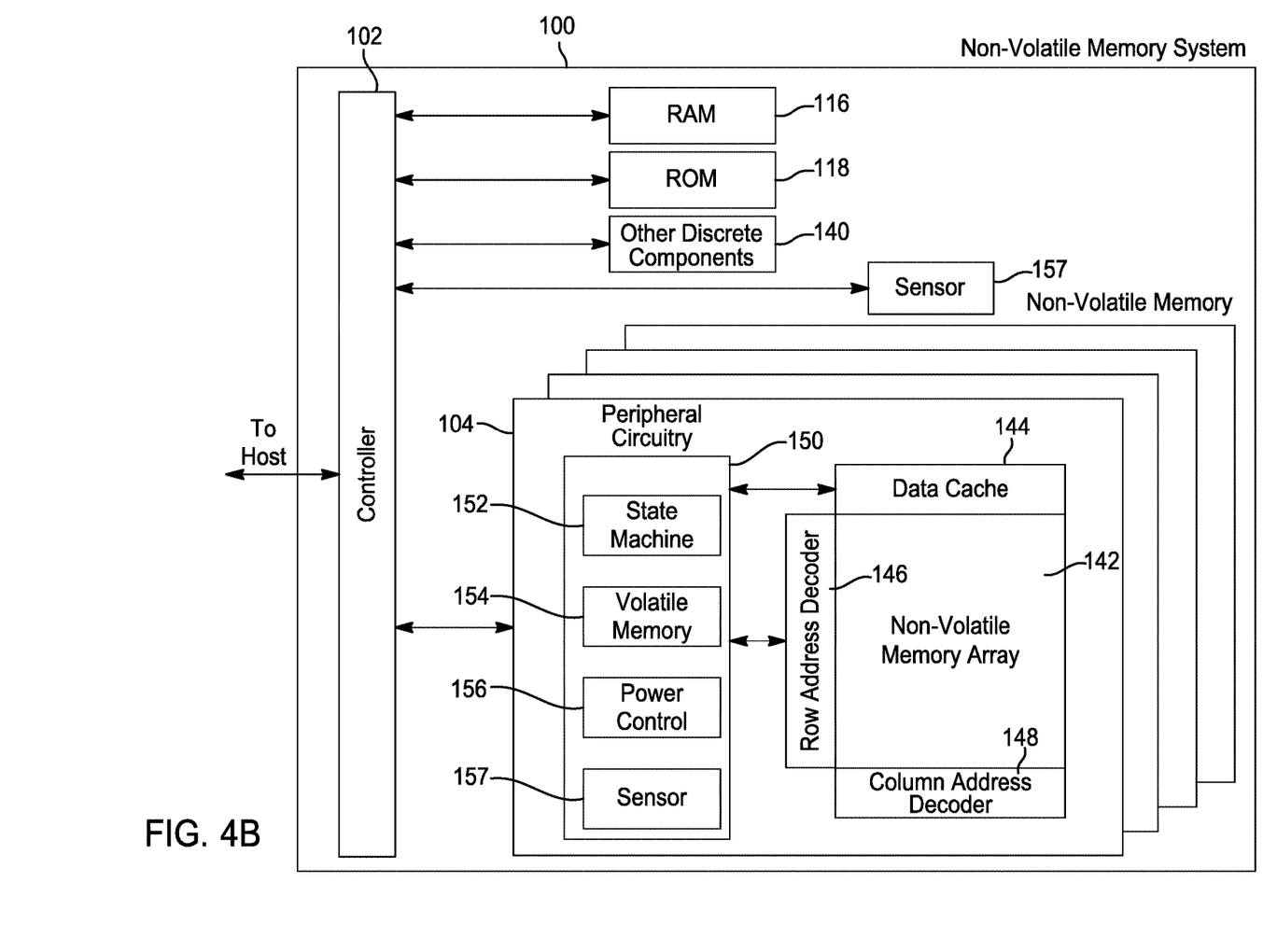
FIG. 4B is a block diagram illustrating example components of a non-volatile memory die, according to an example embodiment.

FIG. 4B is a block diagram illustrating example components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-times programmable, or many-times programmable. In addition, the memory elements or cells may be configured as single-level cells (SLCs) that store a single bit of data per cell, multi-level cells (MLCs) that store multiple (two, three, four, or more) bits of data per cell, or combinations thereof. In one or more example embodiments, the multi-level cells (MLCs) may include triple-level cells (TLCs) that store three bits of data per cell.

In one or more example embodiments, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, the threshold voltage of each may be indicative of the data stored in the memory cell. Hereafter, the terms "FGT," "memory element," and "memory cell" may be used interchangeably to refer to the same physical entity.

The memory cells may be disposed in the memory array 142 in accordance with a matrix-like structure of rows and columns of memory cells. At the intersection of a row and a column is a memory cell. A column of memory cells may be referred to as a string. Memory cells in a string or column may be electrically connected in series. A row of memory cells may be referred to as a page. Control gates of FGTs in a page or row may be electrically connected together.

The memory array 142 may also include wordlines and bitlines connected to the memory cells. Each page of memory cells may be coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 5:
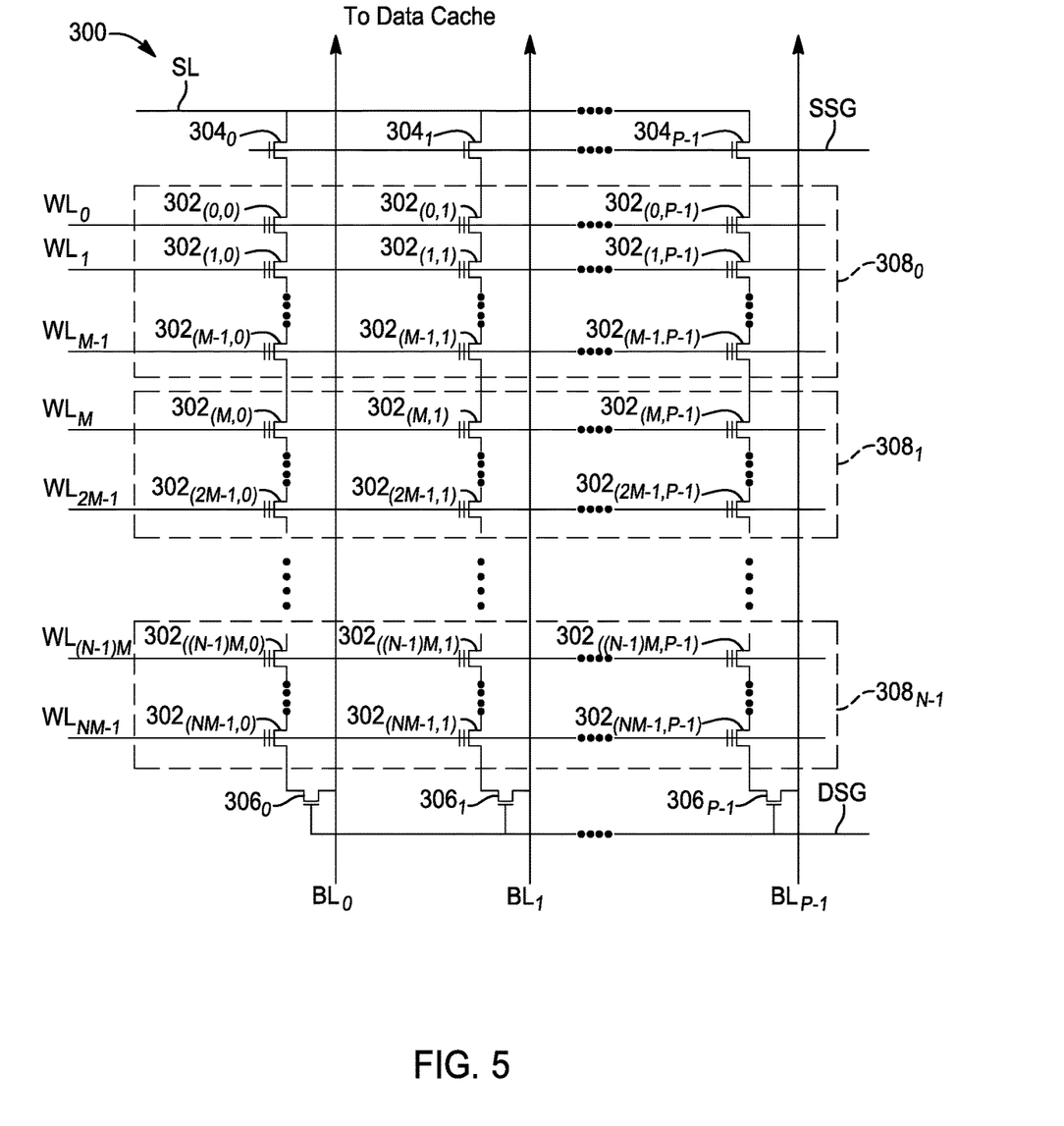
FIG. 5 is a circuit schematic diagram of at least a portion of a NAND-type flash memory array, according to an example embodiment.

FIG. 5 is a circuit schematic diagram of at least a portion of an example NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

Referring back to FIG. 4B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

The non-volatile memory die 104 may include peripheral circuitry 150. The peripheral circuitry 150 may include a state machine 152 that may be configured to control memory operations performed on the die 104 and provide status information to the controller 102. The peripheral circuitry 150 may also include volatile memory 154. An example configuration of the volatile memory 154 may include latches, although other configurations are possible. In addition, the peripheral circuitry 150 may include power control circuitry 156 that is configured to generate and supply voltages to the memory array 142, including voltages (such as in the form of voltage pulses) to the wordlines, erase voltages (such as in the form of erase voltage pulses), the source select gate (SSG) bias voltage $V_{SSG}$ to the source select gate bias line SSG, the drain select gate (DSG) bias voltage $V_{DSG}$ to the drain select gate bias line DSG, as well as other voltages that may be supplied to the memory array 142. According to one or more example embodiments, the power control circuitry 156 may include charge pumps to generate the voltages, although other configurations may be possible.

According to one or more example embodiments, a system and method are provided, to decode a data set, in which feedback of system runtime parameters is used during decoding to update reliability metrics which may provide increased error correction capability and faster decoding. Three operations are utilized: the modelling of drift in the reliability matrix of NAND failures with system parameters; a mechanism providing runtime system parameters to a low-density parity-check (LDPC); and decoding driven by runtime system parameters.

According to one or more example embodiments, a system and method are provided, to decode a data set, in which metadata describing block conditions are used to assign an LLR previously determined to decode blocks with corresponding conditions.

According to one or more example embodiments, a system and method are provided in which the metadata describing block conditions are used to assign a corresponding LLR and then feedback of system runtime parameters is used during decoding to update the reliability metrics.

Modelling Drift in Reliability matrix of NAND failures: During device characterization and error modelling, a state-transition-matrix (STM) is created for each NAND error characteristic and influencing system parameters such as, but not limited to, cross-temperature differences, EOL/ program-erase (PE) cycles or status, and edge WLs and other outliner WL. In other words, different scenarios that the NAND is expected to see are modeled. Once an STM is created for a condition, an optimal log-likelihood ratio (LLR) can be calculated with respect to that STM/condition or some combination of STMs/conditions.

Figure 6:
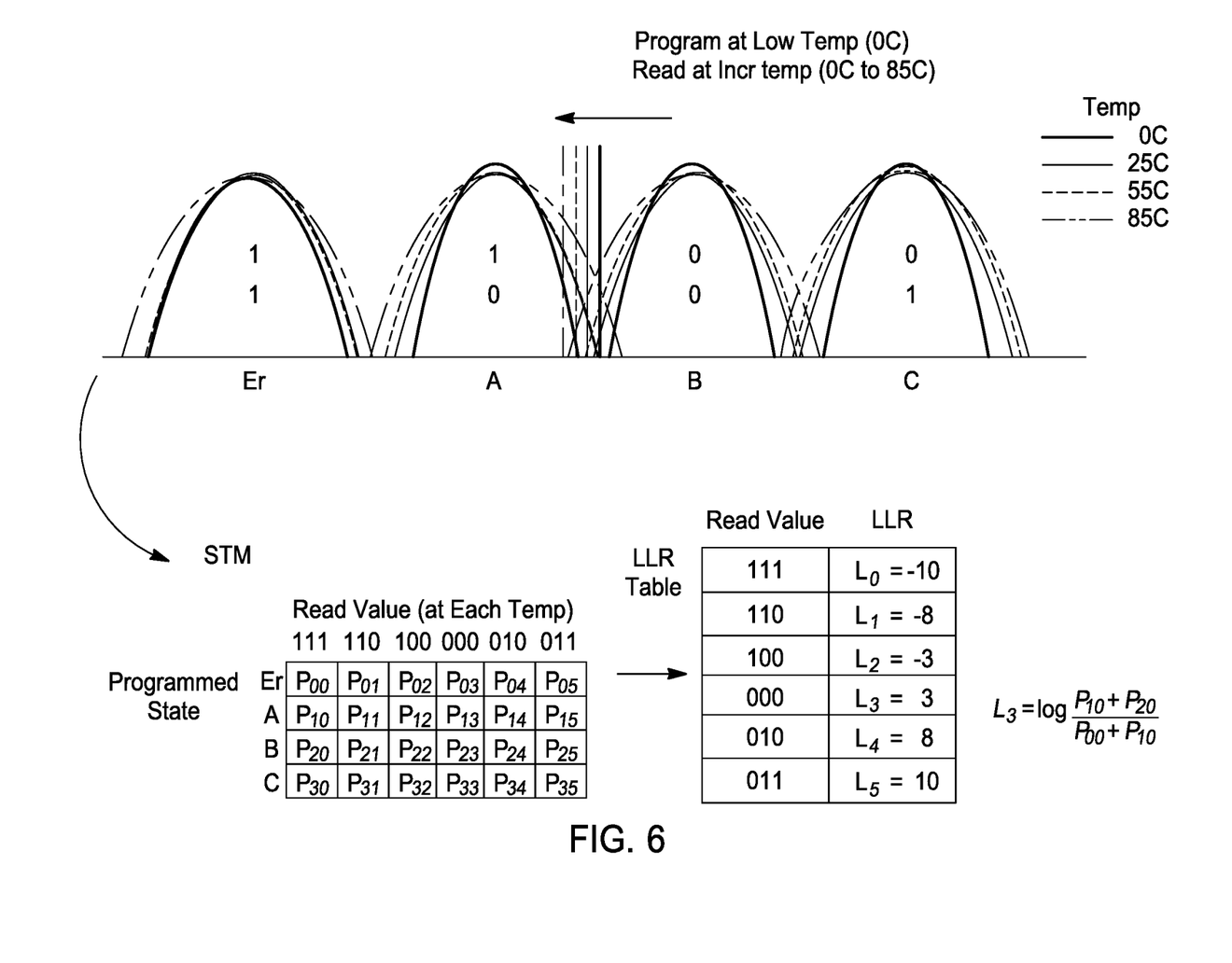
FIG. 6 represents the creation of an STM and corresponding LLR table generation for characterization of a cross-temperature scenario, according to an example embodiment.

FIG. 6 represents the creation of an STM and corresponding LLR table generation for characterization of a cross-temperature scenario, according to an example embodiment. As discussed above, according to related art, a Gaussian model is assumed. In contrast, according to this example embodiment, the distribution can actually be measured. The vertical axis represents the number of bits read at a certain voltage, and the horizontal axis represents voltage. In FIG. 5, there are two bits in four states, including soft bits. The distribution is translated into the STM including probabilities $P_{00}$-$P_{35}$. The STM is then used to calculate the LLR table.

Mechanism providing runtime system parameters to the LDPC: According to an example embodiment, parameter collection is performed at different stages.

During encoding, firmware, e.g. within the media management layer 138, as shown in FIG. 4A, can track the NAND temperature at the block level or at a level of finer granularity, via the one or more temperature sensors 157, though a block is often programmed at a same temperature. This keeps information size manageable and forms the program temperature. Thus, the firmware provides the program data to the NAND, and the NAND detects and provides the NAND program temperature to the firmware.

During decoding, as part of a decoded descriptor, additional information of the temperature at which a WL is programmed (as maintained by the firmware), as well as current read temperature detected from the NAND, is provided to the LDPC, represented by the ECC 124 in FIG. 4A. Similarly, PE cycles of a block, maintained by the firmware, can be provided as part of a decode descriptor. Current read voltage levels (digital-to-analog (DAC) shift driven from Cell Voltage Distribution (CVD)/BER Estimation Scan (BES) operation) may also be a part of a decode descriptor to enables choice of LLR at granular levels. This may compensate for error correction already achieved by shifting the sense voltage value at the NAND level. The physical address is already part of a decode descriptor, and based on this address information, outlier WLs can be detected, and an appropriate LLR can be selected accordingly.

Figure 7:
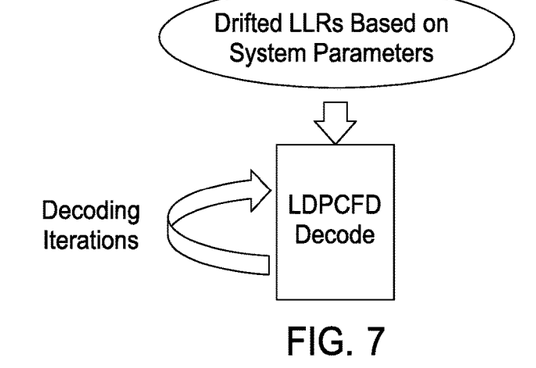
FIG. 7 illustrates iterations of LDPC decoding, according to an example embodiment.

Runtime system parameters driving decoding: Either of two approaches may be used to characterize data in LDPC decoding. According to a first example approach, multiple LLR tables are created based on various runtime system properties like temperature and PE cycle, for example. By using descriptor information, the LDPC may choose an appropriate error-modeled a-priori LLR table, as per a specific system parameter(s), and begin decoding. This would improve LDPC correction capabilities and help to converge faster to a specific set of LLRs. In other words, according to this example approach, the LDPC is provided with a number of a-priori LLR tables, and a single table is chosen based on system parameters, to perform the decoding. Thus, the multiple decoding iterations are performed using the chosen a-priori LLR table, as shown, for example, in FIG. 7.

According to a second example approach, a drifted reliability matrix calculation is performed. During characterization, a drift magnitude and a rate of error modeled-reliability-matrices are created based on original a-priori reliability matrices. These are assessed in view of varying parameters to derive weight factors. Features which influence NAND failures, such as, but not limited to cross-temperature scenarios and PE cycles, to cause a drift in the reliability matrix, are characterized in order to derive the parameter weightage. For example, a temperature weightage $W_T$ is a function of the cross-temperature reliability matrix and the a-priori reliability matrix, e.g.: (Cross temperature RM-a-priori RM), the program temperature, and the read temperature. A PE cycle weightage may be a function of the PE cycle reliability matrix, the a-priori reliability matrix, e.g.: (PE cycle RM-a-priori RM), and the PE count. A Sense DAC weightage may be a function of the Sense DAC reliability matrix, the a-priori matrix, e.g.: (Sense DAC RM-a-priori RM), and the Sense DAC.

The weighted factors such as, but not limited to, the Temperature Weightage ($W_T$), the PE Weightage ($W_{PE}$), the DAC Weightage ($W_{DAC}$), outliers, and other runtime quantifiable factors, are memory-specific. For each memory type, such reliability matrices are characterized to derive the Parameter Weightages. The rate of drift may also be quantified as per the parameters. For example, during decoding, as per the data received from the firmware, the rate of drift with respect to each parameter may be used to derive the LLR In this way, the a-priori reliability metric values are updated/drifted based on the weighted factors calculated during characterization.

According to an example embodiment, the systems and methods described herein may be used in conjunction with a system or method in which more accurate LLR values are obtained using LLR estimations, or information exchange between the decoder and LLR estimator, e.g. a system in which the a-priori LLRs are updated between decoding iterations. In such a decoding operation, the LDPC begins decoding with the original, a-priori, LLR table. However, thereafter, at each of several decoding iterations, an update stage may be performed in which the current LLRs and the original data read from the NAND are used to improve the estimation of the a-priori LLRs. This is an iterative process, wherein each stage aims to improve the accuracy of the LLRs until the decoder converges to the correct code-word.

In this case, the runtime parameters are factored in to generate/select the LLR based on combinations of conditions. This may be a more accurate LLR than the original, static LLR, and is specific to the runtime parameters. Using an error model specific a-priori LLR may thus improve the estimation which a higher error correction capability and faster decoding.

As is evident from the above description, the accuracy of a decoder is dependent on the initial LLR values used.

According to another example embodiment, the LDPC decoder is provided with metadata from the Flash Management Unit (FMU), which may be located within the media management layer 138, as shown in FIG. 4A, regarding conditions of the block from which the read data originated, and uses this metadata to select a corresponding LLR table. Details regarding conditions of a block from which data is successfully decoded may be identified, and the final LLRs that are produced from that successful decode may later be used in decoding of data from a block with corresponding conditions.

Figure 8:
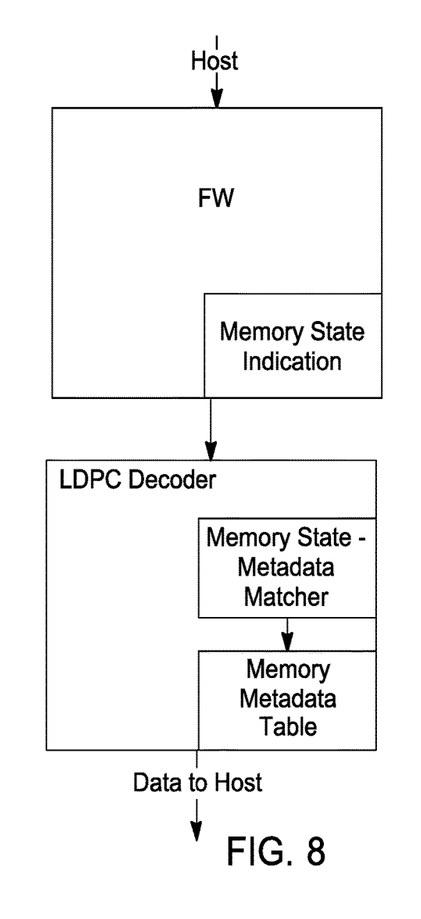
FIG. 8 illustrates firmware and an LDPC decoder, according to an example embodiment.

The ECC 124, for example an LDPC decoder, may include a memory-state metadata matcher and a memory metadata table, as shown in FIG. 8. The firmware may indicate to the ECC the memory state from which data (i.e. a codeword) was read. The memory state may include a cross-temperature indication and direction (e.g. low temp to high temp or high temp to low temp and the extent of the shift), read disturb (a number of overall reads from the block), and data retention (DR). The firmware may also indicate the physical location of the read page. For example, if the page is located on an edge of the block and is an outlier WL. Examples of the metadata which may be provided by the firmware to the ECC 124 may include, for example, the physical location of the page, WL, block, and die (e.g. string number or tier); the P/E cycles; the write temperature, the read temperature, an RD count, and DR. A size of the memory characteristics table (memory metadata table) may be limited due to hardware size restrictions, and thus, there may be a limited number of LLR configurations and their corresponding metadata.

When the firmware sends data/a codeword for decoding, it may supply the metadata as a "key" for the memory metadata table. However, as there are many variables, it is not guaranteed that this exact metadata entry exists in the table. In case an exact match is missing, the ECC 124 will look for a closest entry, such that its LLRs are still relevant even though it doesn't match the metadata exactly. This matching process may be conducted by a memory metadata matcher block in the ECC/LDPC decoder prior to the initial LLRs being selected.

The matching process may include seeking the closest entry in the memory metadata table according to a distance metric. This distance metric may be a normalized Euclidian distance across all the relevant variables. It will be normalized as some variables, such as cross temperature, may have more impact than others, such as the RD count. The normalization and calibration of the variables may be performed in advance, offline, or an online step performed during operation.

The memory metadata table, which may be located in the ECC 124/LDPC decoder, may store LLR values that were last used for decoding the indicated memory state and position.

The memory metadata table may be updated after a successful decode, not only by replacing the LLR values directly but also by a moving average that considers the past LLR values used to decode the indicated memory state.

After successful decode, a learning process may be conducted to check whether the metadata of the decoding instance is similar to entries currently in the memory metadata table. For example, if the successful decode is distinct enough from existing entries, it may be added to the table. A "hit rate" of each of the table's entries may be maintained, and entries that are not used may be replaced by other entries.

Figure 9:
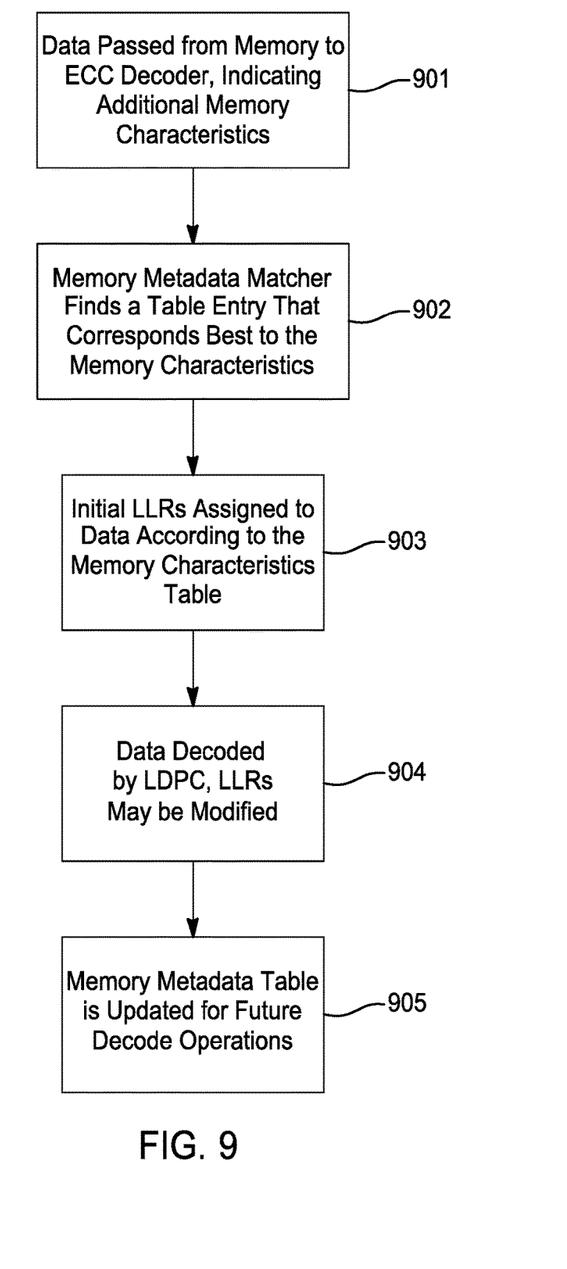
FIG. 9 is a flowchart of a decoding method according to an example embodiment.

FIG. 9 is a flowchart according to an example embodiment. Data is transmitted from the memory 104 to the ECC decoder 124 along with an indication of characteristics of the memory (metadata) (901). The memory metadata matcher finds a table entry that corresponds best to the current metadata (902). Initial LLRs are assigned to the data according to the memory metadata table (903). The data is decoded by the ECC 124/LDPC (904). The LLRs may be modified during decoding. The memory metadata table is updated for future decode operations.

According to one or more example embodiments described herein, an improved decoder correction capability may be provided in cross temperature situations, as the reliability matrix used for convergence is a more accurate NAND error model with runtime-fed system parameters than a default a-priori error model.

According to one or more example embodiments described herein, faster convergence and decoding may be provided. Since runtime parameters like program and read temperatures, and PE cycles are fed to the LDPC at block level, each decode operation may be based on an e-block specific reliability matrix and thus provide a more accurate estimation of the NAND error model, which in turn, may be used to calculate more accurate LLRs. This may provide faster convergence and decoding.

According to one or more example embodiments described herein, a uniform decoding time may be provided throughout the life of a card. As the reliability matrix is based on a PE cycle error drift model with memory-specific weighted system parameters, the time to derive a reliability matrix becomes uniform even at the mid- and end-life of a card.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

The example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:
1. A decoding method comprising:
creating a plurality of log-likelihood-ratio (LLR) tables, wherein each of the plurality of LLR tables corresponds to at least one characteristic of a plurality of characteristics of a non-volatile memory, the creating comprising creating an a-priori state-transition-matrix (STM) for each of the plurality of characteristics;
reading a codeword from the non-volatile memory;
receiving metadata comprising information of at least one of the plurality of characteristics;
determining an initial LLR table from among the plurality of LLR tables using the metadata; and
decoding the codeword using the determined initial LLR table;
wherein the determining the initial LLR table comprises:
performing a drifted reliability matrix calculation by deriving a characteristic weightage for the at least one characteristic of the non-volatile memory based on the metadata and the a-priori STM for the at least one characteristic.

2. The decoding method of claim 1, wherein the determining the initial LLR table comprises matching the metadata with one of the plurality of LLR tables most closely corresponding to the at least one characteristic.

3. The decoding method of claim 1, wherein the decoding comprises low density parity check decoding.

4. A decoding method comprising:
reading a codeword from a non-volatile memory;
receiving metadata comprising information of at least one characteristic of a plurality of characteristics of the non-volatile memory;

determining an initial log-likelihood-ratio (LLR) table from among a plurality of LLR tables using the metadata; and decoding the codeword using the determined initial LLR table, wherein the decoding comprises low density parity check decoding, and wherein the decoding comprises performing multiple decoding iterations using the initial LLR table.

5. A decoding method comprising:

reading a codeword from a non-volatile memory;

receiving metadata comprising information of at least one characteristic of a plurality of characteristics of the non-volatile memory;

determining an initial log-likelihood-ratio (LLR) table from among a plurality of LLR tables using the metadata;

decoding the codeword using the determined initial LLR table;

wherein the decoding comprises low density parity check decoding;

wherein the decoding comprises performing at least one decoding iteration using the initial LLR table, and updating the initial LLR table to create an updated LLR table and performing at least one decoding iteration using the updated LLR table.

6. A non-volatile memory system comprising:

a non-volatile memory; and a controller circuit;

wherein the non-volatile memory is configured to transmit, to the controller circuit, a codeword; and wherein the controller circuit comprises a decoder configured to:

create a plurality of log-likelihood-ratio (LLR) tables, wherein each of the plurality of LLR tables corresponds to at least one characteristic of a plurality of characteristics of the non-volatile memory, wherein the decoder creates the plurality of LLR tables by creating an a-priori state-transition-matrix (STM) for each of the plurality of characteristics;

receive metadata comprising information of at least one characteristic of the plurality of characteristics of the non-volatile memory;

determine an initial LLR table from among the plurality of LLR tables using the metadata; and decode the codeword using the determined initial LLR table;

wherein the at least one characteristic of the non-volatile memory comprises at least one of a current read voltage level, a cross-temperature difference, and a location of the codeword in the non-volatile memory; and wherein the decoder determines the initial LLR table by performing a drifted reliability matrix calculation by deriving a characteristic weightage for the at least one characteristic of the non-volatile memory based on the metadata and the a-priori STM for the at least one characteristic.

7. The memory system of claim 6, wherein the decoder is a low-density-parity-check decoder.

8. A non-transitory computer-readable medium having recorded thereon a program which, when executed by a processor, causes the processor to execute a method comprising:

creating a plurality of log-likelihood-ratio (LLR) tables, wherein each of the plurality of LLR tables corresponds to at least one of a plurality of characteristics of the non-volatile memory, wherein the creating the plurality of LLR tables comprises creating an a-priori state-transition matrix (STM) for each of the plurality of characteristics of the non-volatile memory;

reading a codeword from a non-volatile memory;

receiving metadata comprising information of at least one characteristic of the plurality of characteristics of the non-volatile memory;

determining an initial LLR table from among a plurality of LLR tables using the metadata;

decoding the codeword using the determined initial LLR table;

wherein the at least one characteristic of the non-volatile memory comprises at least one of a current read voltage level, a cross-temperature difference, and a location of the codeword in the non-volatile memory; and wherein the determining the initial LLR table comprises:

performing a drifted reliability matrix calculation by deriving a characteristic weightage for the at least one characteristic of the non-volatile memory based on the metadata and the a-priori STM for the at least one characteristic.

9. The non-transitory computer-readable medium of claim 8, wherein the determining the initial LLR table comprises matching the metadata with one of the plurality of LLR tables most closely corresponding to the at least one characteristic.

* * * * *